(12) United States Patent
Kyoung et al.

(10) Patent No.: US 11,563,199 B2
(45) Date of Patent: *Jan. 24, 2023

(54) LIGHT EMITTING DEVICE AND DISPLAY APPARATUS INCLUDING THE SAME

(71) Applicant: SAMSUNG ELECTRONICS CO., LTD., Suwon-si (KR)

(72) Inventors: Jisoo Kyoung, Seoul (KR); Wonjae Joo, Seongnam-si (KR); Youngnam Kwon, Seoul (KR); Byonggwon Song, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 88 days.

This patent is subject to a terminal disclaimer.

(21) Appl. No.: 17/162,588

(22) Filed: Jan. 29, 2021

(65) Prior Publication Data

US 2021/0151716 A1    May 20, 2021

Related U.S. Application Data

(63) Continuation of application No. 16/263,080, filed on Jan. 31, 2019, now Pat. No. 10,950,823.

(30) Foreign Application Priority Data

Aug. 20, 2018   (KR) .................. 10-2018-0096826

(51) Int. Cl.
  *H01L 51/52*   (2006.01)
  *H01L 27/32*   (2006.01)
  *H01L 51/50*   (2006.01)

(52) U.S. Cl.
  CPC ........ *H01L 51/5271* (2013.01); *H01L 27/322* (2013.01); *H01L 27/3244* (2013.01);
  (Continued)

(58) Field of Classification Search
None
See application file for complete search history.

(56) References Cited

U.S. PATENT DOCUMENTS 6,593,689 B2   7/2003   Hayashi et al.
7,285,459 B2   10/2007   Seo et al.
(Continued)

FOREIGN PATENT DOCUMENTS

EP   2 800 456 A1   11/2014
KR   10-0462858 B1   12/2004
(Continued)

OTHER PUBLICATIONS

Communication dated Dec. 16, 2019, issued by the European Patent Office in counterpart European Application No. 19171628.1.

*Primary Examiner* — Robert K Carpenter
(74) *Attorney, Agent, or Firm* — Sughrue Mion, PLLC

(57) ABSTRACT

A light emitting device and a display apparatus including a phase shifting mirror are provided. The light emitting device includes a first electrode, a light emitting structure, a second electrode, and a phase shifting mirror. The phase shifting mirror has a number of patterns arranged in a periodic manner with an interval between adjacent patterns. Each pattern has a top surface and a side surface between the top surface of the respective pattern and the top surface of the first electrode. A first width at a bottom portion of the respective pattern directly adjacent to the top surface of the first electrode is greater than a second width of the top surface of the respective pattern, and the first width and the second width are less than a wavelength of light generated in the light emitting structure.

20 Claims, 10 Drawing Sheets

(52) U.S. Cl.
CPC ...... *H01L 51/5056* (2013.01); *H01L 51/5072* (2013.01); *H01L 51/5092* (2013.01); *H01L 51/5218* (2013.01); *H01L 51/5225* (2013.01); *H01L 51/5096* (2013.01)

(56) References Cited

U.S. PATENT DOCUMENTS

| | | |
|---|---|---|
| 8,174,186 B2 | 5/2012 | Kim et al. |
| 10,950,823 B2 * | 3/2021 | Kyoung .............. H01L 51/5056 |
| 2010/0141612 A1 | 6/2010 | Desieres et al. |
| 2010/0219427 A1 | 9/2010 | Fukuda |
| 2014/0001450 A1 | 1/2014 | Shinotsuka et al. |
| 2014/0191202 A1 | 7/2014 | Shim et al. |
| 2016/0285036 A1 | 9/2016 | Wang et al. |

FOREIGN PATENT DOCUMENTS

| | | |
|---|---|---|
| KR | 10-0606817 B1 | 8/2006 |
| KR | 10-0700500 B1 | 3/2007 |
| WO | 2008061988 A1 | 5/2008 |
| WO | 2015/070217 A1 | 5/2015 |

\* cited by examiner

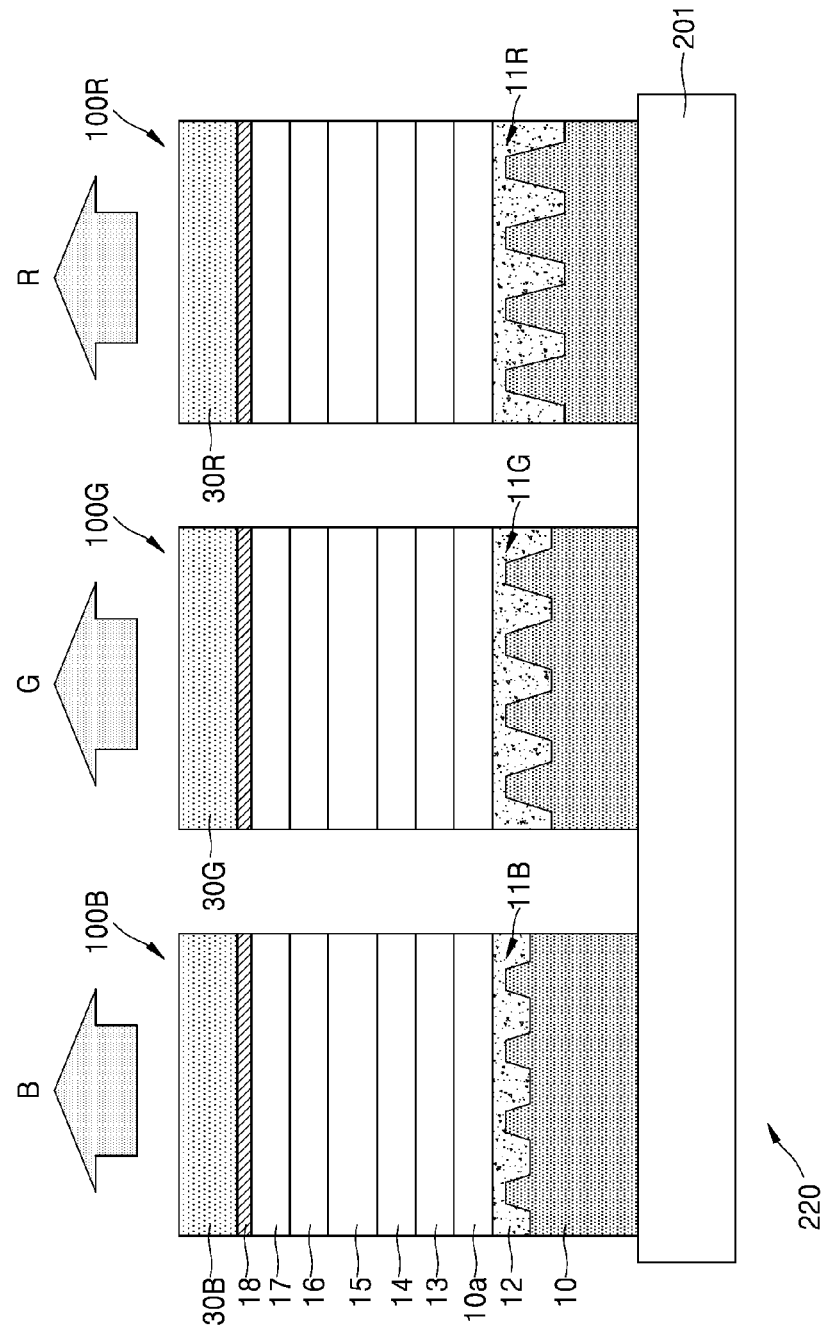

LIGHT EMITTING DEVICE AND DISPLAY APPARATUS INCLUDING THE SAME

CROSS-REFERENCE TO RELATED APPLICATION

This application is a continuation of U.S. application Ser. No. 16/263,080 filed Jan. 31, 2019, which claims the benefit of Korean Patent Application No. 10-2018-0096826, filed on Aug. 20, 2018, in the Korean Intellectual Property Office, the disclosures of which are incorporated herein in their entirety by reference.

BACKGROUND

1. Field

The present disclosure relates to a light emitting device and a display apparatus including the light emitting device, and more particularly to, an organic light emitting device having a phase shifting mirror and an organic light emitting display apparatus.

2. Description of the Related Art

An organic light emitting device (OLED) is a display device that forms an image via light emission according to a combination of holes supplied from an anode and electrons supplied from a cathode in an organic emission layer. The OLED has excellent display characteristics such as a wide viewing angle, a fast response speed, a thin thickness, a low manufacturing cost, and a high contrast.

Further, the OLED may emit a desired color by selecting an appropriate material as a material of the organic emission layer. According to this principle, it may be possible to manufacture a color display apparatus by using the OLED. For example, an organic emission layer of a blue pixel may include an organic material that generates blue light, an organic emission layer of a green pixel may include an organic material that generates green light, and an organic emission layer of a red pixel may include an organic material that generates red light. Alternatively, a white OLED may be manufactured by arranging a plurality of organic materials which respectively generate blue light, green light, and red light in one organic emission layer or by arranging pairs of two or more kinds of organic materials in a complementary relationship with each other.

SUMMARY

According to an aspect of the disclosure, there is provided a light emitting device comprising: a first electrode; a light emitting structure disposed on the first electrode; a second electrode disposed on the light emitting structure; and a phase shifting mirror formed on a top surface of the first electrode, the phase shifting mirror comprising a plurality of patterns arranged in a periodic manner with an interval between adjacent patterns, wherein each of the plurality of patterns comprises a top surface and a side surface between the top surface of the respective pattern and the top surface of the first electrode, wherein a first width at a bottom portion of the respective pattern directly adjacent to the top surface of the first electrode is greater than a second width of the top surface of the respective pattern, and wherein the first width and the second width are less than a wavelength of light generated in the light emitting structure.

The phase shifting mirror and the second electrode may constitute a resonator having a resonance wavelength, and the resonance wavelength of the resonator maybe determined according to at least one of the first width, the second width, a depth of each of the plurality of patterns, and an arrangement period of the plurality of patterns.

When the resonance wavelength of the resonator is $\lambda$, at least one of the first width, the second width, the depth of each of the plurality of patterns, and the arrangement period of the plurality of patterns maybe selected such that an optical length of the resonator satisfies $n\lambda/2$, n is a natural number.

The second electrode maybe a transflective electrode that reflects a part of light and transmits another part of the light.

The side surface of each of the plurality of patterns maybe an inclined surface.

Each of the plurality of patterns may have a rod shape extending in a first direction, and the plurality of patterns maybe arranged along a second direction perpendicular to the first direction.

Each of the plurality of patterns may have a truncated conical shape or a truncated polygonal pyramid shape, and the plurality of patterns maybe two-dimensionally arranged.

The first electrode may comprise a reflective metal material, and the phase shifting mirror may comprise a same reflective metal material as the first electrode.

The first electrode may comprise a reflective metal material, and the phase shifting mirror may comprise a different reflective metal material from the first electrode.

A sum of the first width and the second width maybe less than the wavelength of the light generated in the light emitting structure.

A sum of the first width and the second width maybe less than ⅓ of the wavelength of the light generated in the light emitting structure.

The light emitting structure may comprise: a hole injection layer disposed on the first electrode; a hole transport layer disposed on the hole injection layer; an organic emission layer disposed on the hole transport layer; an electron transport layer disposed on the organic emission layer; and an electron injection layer disposed on the electron transport layer.

The light emitting device may further comprise: a dielectric layer is formed between the plurality of patterns of the phase shifting mirror.

The dielectric layer maybe configured to completely cover top surfaces of the plurality of patterns, and the light emitting device may further comprise: a transparent electrode disposed between the dielectric layer and the light emitting structure.

The light emitting device may further comprise a wiring configured to electrically connect the first electrode to the transparent electrode.

The light emitting device may further comprise: a transparent electrode disposed between the phase shifting mirror and the light emitting structure.

According to another aspect of the disclosure, there is provided a display apparatus comprising: a first pixel configured to emit light of a first wavelength; and a second pixel configured to emit light of a second wavelength different from the first wavelength, wherein the first pixel comprises: a first electrode; a first light emitting structure disposed on the first electrode; a second electrode disposed on the first light emitting structure; and a first phase shifting mirror formed on a top surface of the first electrode, the first phase shifting mirror comprising a plurality of patterns arranged in a periodic manner, wherein each of the plurality of patterns comprises a top surface and a side surface between the top surface of the respective pattern and the top surface of the first electrode, wherein a first width at a bottom portion of the respective pattern directly adjacent to the top surface of the first electrode is greater than a second width of the top surface of the respective pattern, and wherein the first width and the second width are less than a wavelength of light generated in the first light emitting structure.

The first phase shifting mirror and the second electrode may constitute a first resonator having a resonance wavelength, and a distance between the second electrode and the top surface of each of the plurality of patterns, the first width of each of the plurality of patterns, the second width of each of the plurality of patterns, and a depth of each of the plurality of patterns maybe selected such that the resonance wavelength of the first resonator is identical to the first wavelength.

The second pixel may comprise: a third electrode; a second light emitting structure disposed on the third electrode; and a fourth electrode disposed on the second light emitting structure.

The third electrode and the fourth electrode may constitute a second resonator having a resonance wavelength, and a distance between the third electrode and the fourth electrode maybe selected such that the resonance wavelength of the second resonator is identical to the second wavelength.

A distance between the second electrode and the top surface of each of the plurality of patterns and the distance between the third electrode and the fourth electrode maybe same.

Both the first light emitting structure and the second light emitting structure maybe configured to emit white visible light.

The display apparatus may further comprises: a third pixel configured to emit light of a third wavelength different from the first wavelength and the second wavelength, wherein the third pixel may comprise: a fifth electrode; a third light emitting structure disposed on the fifth electrode; a sixth electrode disposed on the light emitting structure; and a second phase shifting mirror formed on a top surface of the fifth electrode, the second phase shifting mirror comprising a plurality of patterns arranged in a periodic manner, wherein each of the plurality of patterns of the third pixel comprises a top surface and a side surface between the top surface of the respective pattern and the top surface of the fifth electrode, wherein a third width at a bottom portion of the respective pattern directly adjacent to the top surface of the fifth electrode of each of the plurality of patterns of the third pixel is greater than a fourth width of the respective pattern of each of the plurality of patterns of the third pixel, and wherein the third width of the third pixel and the fourth width of the third pixel are less than a wavelength of light generated in the third light emitting structure.

The second phase shifting mirror and the sixth electrode of the third pixel may constitute a third resonator having a resonance wavelength, and a distance between the sixth electrode and the top surface of each of the plurality of patterns of the third pixel, the third width of each of the plurality of patterns of the third pixel, the fourth width of each of the plurality of patterns of the third pixel, and a depth of each of the plurality of patterns of the third pixel are selected such that the resonance wavelength of the third resonator maybe identical to the third wavelength.

The distance between the sixth electrode and the top surface of each of the plurality of patterns of the third pixel and the distance between the second electrode and the top surface of each of the plurality of patterns of the first pixel maybe same, and the depth of each of the plurality of patterns of the third pixel maybe different from the depth of each of the plurality of patterns of the first pixel.

According to another aspect of the disclosure, there is provided a light emitting device comprising: a first electrode; a phase shifting mirror formed on a top surface of the first electrode; a light emitting structure disposed above the first electrode and the phase shifting mirror; and a second electrode disposed on the light emitting structure, wherein the phase shift mirror comprises a plurality of patterns arranged with an interval between adjacent patterns, and wherein a dimension of each of the plurality of patterns is configured based on a wavelength of light generated in the light emitting structure.

The light emitting device may further comprise: a dielectric layer formed between the plurality of patterns of the phase shifting mirror.

A first width at a bottom portion of a pattern, among the plurality of patterns, directly adjacent to the top surface of the first electrode maybe greater than a second width of a top surface of the pattern.

The first electrode and the phase shifting mirror maybe integrally formed as a single structure.

The first electrode and the phase shifting mirror maybe formed as separate structure.

BRIEF DESCRIPTION OF THE DRAWINGS

These and/or other aspects will become apparent and more readily appreciated from the following description of the embodiments, taken in conjunction with the accompanying drawings in which:

FIG. 13 is a cross-sectional view schematically showing a structure of a display apparatus according to another embodiment.

DETAILED DESCRIPTION

Figure 1:
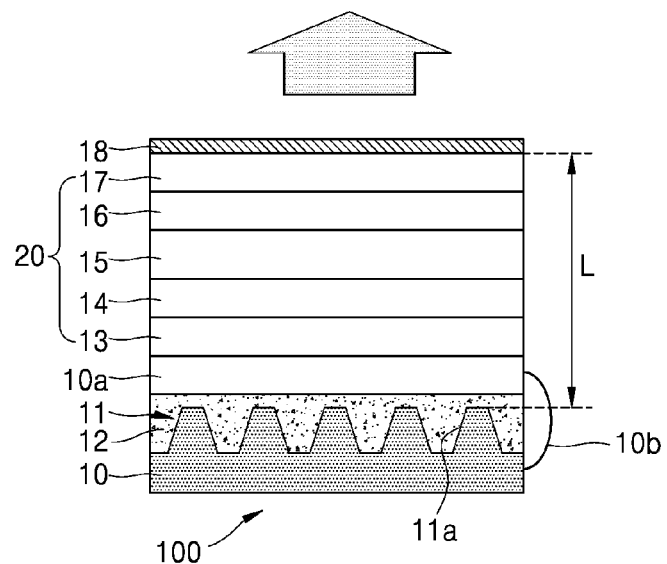
FIG. 1 is a cross-sectional view showing a structure of a light emitting device according to an embodiment.

Hereinafter, with reference to the accompanying drawings, an organic light emitting device having a phase shifting mirror and an organic light emitting display apparatus will be described in detail. Like reference numerals refer to like elements throughout, and in the drawings, sizes of elements may be exaggerated for clarity and convenience of explanation. The embodiments described below are merely exemplary, and various modifications may be possible from the embodiments. In a layer structure described below, an expression "above" or "on" may include not only "immediately on in a contact manner" but also "on in a non-contact manner".

FIG. 1 is a cross-sectional view showing a structure of a light emitting device 100 according to an embodiment. Referring to FIG. 1, the light emitting device 100 according to an embodiment may include a first electrode 10, a light emitting structure 20 disposed on the first electrode 10, and a second electrode 18 disposed on the light emitting structure 20. The light emitting device 100 may further include a phase shifting mirror 11 having a plurality of patterns on a surface of the first electrode 10 opposite the second electrode 18. According to an embodiment, the plurality of patterns are arranged in a periodic manner.

The light emitting device 100 may be an organic light emitting diode (OLED). According to an embodiment, the light emitting structure 20 may include a hole injection layer 13, a hole transport layer 14 disposed on the hole injection layer 13, an organic emission layer 15 disposed on the hole transport layer 14, an electron transport layer 16 disposed on the organic emission layer 15, and an electron injection layer 17 disposed on the electron transport layer 16. Also, although not shown in FIG. 1, the light emitting structure 20 may include various additional layers as needed. According to an embodiment, the light emitting structure 20 may further include an electron block layer between the hole transport layer 14 and the organic emission layer 15, and may further include a hole block layer between the organic emission layer 15 and the electron transport layer 16. In this structure, holes provided through the hole injection layer 13 and the hole transport layer 14 and electrons provided through the electron injection layer 17 and the electron transport layer 16 may combine in the organic emission layer 15, thereby generating light. A wavelength of the generated light may be determined according to an energy band gap of a light emitting material of the organic emission layer 15.

A structure of the OLED described above is only an example of the light emitting device 100, and the light emitting device 100 is not limited to the OLED. Thus, the structure and principle of the light emitting device 100 according to the embodiment of the disclosure may be applied to an inorganic light emitting diode. Hereinafter, it is assumed that the light emitting device 100 is an OLED.

According to an embodiment, the first electrode 10 disposed in a lower portion of the light emitting structure 20 may be a reflective electrode that reflects light (e.g., visible light) and may serve as an anode for providing holes. The second electrode 18 disposed on an upper portion of the light emitting structure 20 may be a transflective electrode that reflects a part of light and transmits another part of the light, and may serve as a cathode for providing electrons. According to the embodiment, the first electrode 10 may include a metallic material having excellent reflectance and electrical conductivity, such as silver (Ag) or aluminum (Al), and the second electrode 18 may include a reflective metal of a very thin thickness. According to an embodiment, the second electrode 18 may be a mixed layer of aluminum (Al), silver (Ag) and magnesium (Mg), or a mixed layer of aluminum (Al) and lithium (Li), and an entire thickness of the second electrode 18 may be about 5 nm to about 20 nm. Although the second electrode 18 includes a metal, since the thickness of the second electrode 18 is very thin, a part of the light may pass through the second electrode 18 and another part thereof may be reflected.

According to an embodiment, the phase shifting mirror 11 may include the same conductive material as the first electrode 10 and may be a part of the first electrode 10. That is, the phase shifting mirror 11 may be formed integrally with the first electrode 10. In an embodiment, a flat upper surface of the first electrode 10 may be etched to form the phase shifting mirror 11. Since the phase shifting mirror 11 has a plurality of nano scale patterns 11a, the phase of a reflected light reflected by the phase shifting mirror 11 may be changed.

The light emitting device 100 may further include a dielectric layer 12 formed by dielectric material filled between a plurality of patterns 11a of the phase shifting mirror 11. In an embodiment, the dielectric layer 12 may include a transparent and insulating material with respect to visible light such as $SiO_2$, $SiN_x$, $Al_2O_3$, $HfO_2$, and the like. A phase of the reflected light may also be adjusted according to a refractive index of the dielectric layer 12. Also, the dielectric layer 12 may serve as a planarization layer for forming the light emitting structure 20 on the first electrode 10. To this end, the dielectric layer 12 may completely cover an upper surface of the pattern 11a, and an upper surface of the dielectric layer 12 may be flat.

The light emitting device 100 may further include a transparent electrode 10a disposed between the dielectric layer 12 and the light emitting structure 20 and a wiring 10b electrically connecting the transparent electrode 10a and the first electrode 10. According to an embodiment, current may not flow from the first electrode 10 to the light emitting structure 20 when the dielectric layer 12 completely covers the upper surface of the pattern 11a of the phase shifting mirror 11. The transparent electrode 10a and the wiring 10b may serve to electrically connect the light emitting structure 20 to the first electrode 10. The transparent electrode 10a may include a transparent conductive oxide such as ITO (indium tin oxide), IZO (indium zinc oxide), or AZO (aluminum zinc oxide).

Figure 2:
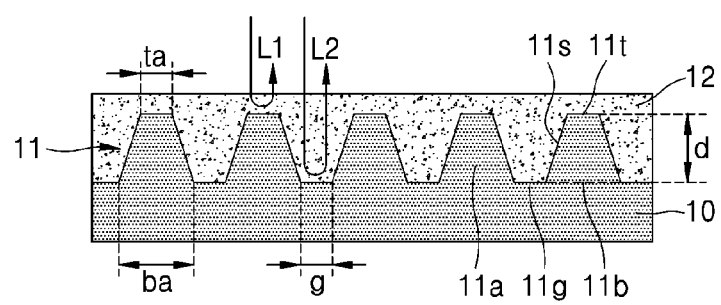
FIG. 2 is an enlarged cross-sectional view of a phase shifting mirror of the light emitting device of FIG. 1 according to an embodiment.

FIG. 2 is an enlarged cross-sectional view of the phase shifting mirror 11 of the light emitting device 100 shown in FIG. 1, according to an embodiment. Referring to FIG. 2, the phase shifting mirror 11 may include a plurality of nano scale patterns 11a arranged at regular intervals. Although only four patterns 11a are shown for convenience in FIG. 2, a very large number of patterns 11a may be actually arranged in the phase shifting mirror 11. Each pattern 11a of the phase shifting mirror 11 may include a bottom surface 11b, a top surface 11t opposed to the bottom surface 11b, and a side surface 11s between the bottom surface 11b and the top surface 11t. An arrangement period of the patterns 11a may be considered as a sum of a width g of an interval 11g between the adjacent two patterns 11a and a width ba of the bottom surface 11b of each pattern 11a.

According to the embodiment, as shown in FIG. 2, the width ba of the bottom surface 11b may be greater than a width to of the top surface 11t, and the side surface 11s may be an inclined surface. Therefore, a cross section of each pattern 11a may have a trapezoidal shape. Then, light may easily penetrate into the interval 11g between the patterns 11a and then be reflected.

For example, a portion L1 of an incident light incident on the phase shifting mirror 11 may be reflected from the top surface 11t of the pattern 11a and another portion L2 may be reflected from an inside of the interval 11g between the patterns 11a. Therefore, a phase difference may occur between the light L1 reflected from the top surface 11t of the pattern 11a and the light L2 reflected from the inside of the interval 11g between the patterns 11a. As described above, the phase shifting mirror 11 may change a phase of the reflected light. When the width ta of the top surface 11t is equal to or larger than the width ba of the bottom surface 11b, since the light may not sufficiently enter into the interval 11g between the patterns 11a, the phase shifting mirror 11 may be difficult to accurately change the phase of the reflected light as wanted.

The phase shift of the reflected light by the phase shifting mirror 11 may be determined according to at least one the width ba of the bottom surface 11b, the width ta of the top surface 11t, the arrangement period of the patterns 11a, and a depth d of the patterns 11a. The size of the patterns 11a may be smaller than a wavelength of the incident light, for example, light generated in the light emitting structure 20, for a uniform and accurate phase shift. When the light emitting structure 20 emits light in a region of visible light, the size of the patterns 11a may be smaller than the visible light. For example, the sum of the width ba of the bottom surface 11b and the width ta of the top surface 11t may be smaller than the wavelength of the light generated in the light emitting structure 20. Alternatively, the sum of the width ba of the bottom surface 11b and the width ta of the top surface 11t may be smaller than ⅓ of the wavelength of the light generated in the light emitting structure 20.

Figure 3A:
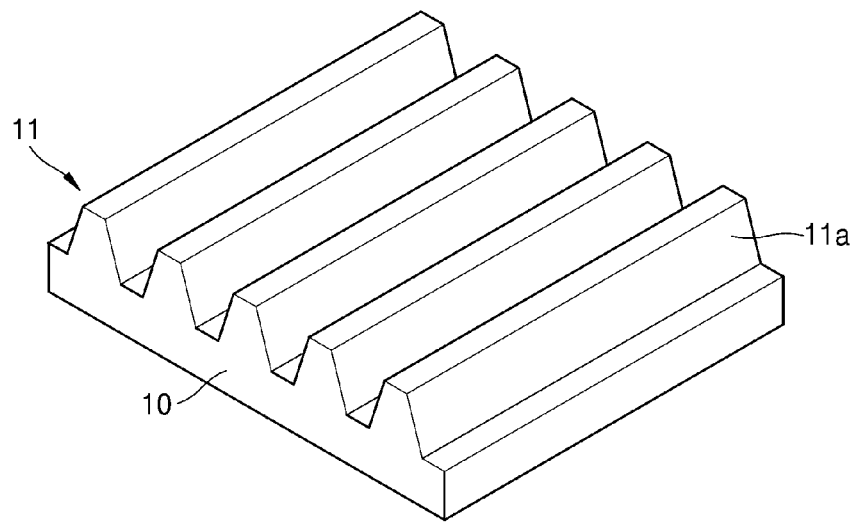
FIGS. 3A to 3C are perspective views showing various shapes of a plurality of patterns of a phase shifting mirror according to an embodiment.
Figure 3B:
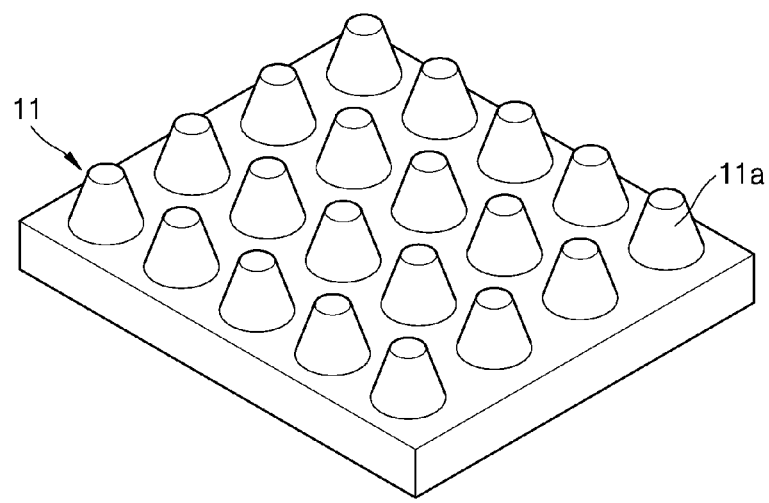
Figure 3C:
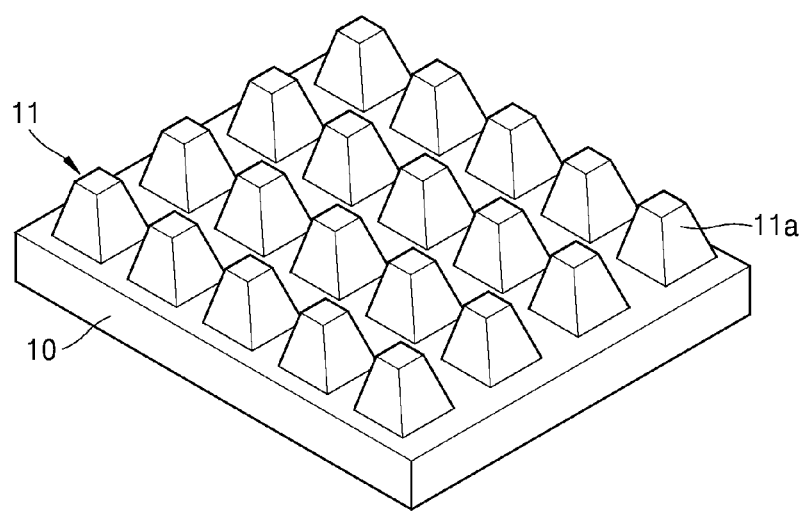

The plurality of patterns 11a of the phase shifting mirror 11 described above may have a one-dimensional (1D) array structure or a two-dimensional (2D) array structure. FIGS. 3A to 3C are perspective views showing various shapes of the plurality of patterns 11a of the phase shifting mirror 11 according to an embodiment.

FIG. 3A shows the one-dimensionally arranged plurality of patterns 11a of the phase shifting mirror 11. Referring to FIG. 3A, each of the patterns 11a may have a rod shape elongated in a first direction, and the plurality of patterns 11a may be arranged along a second direction perpendicular to the first direction. In this case, the width ba of the bottom surface 11b of each pattern 11a may be, for example, about 30 nm to about 300 nm. Also, a ratio r obtained by dividing the width ta of the top surface 11t by the width ba of the bottom surface 11b may be, for example, greater than 0 and less than 1 (0<r<1), and a period p of the patterns 11a may satisfy a relationship of (the width ba of the bottom face 11b+10 nm)≤p≤(a wavelength of light generated in the light emitting structure 20).

Also, FIGS. 3B and 3C show the two-dimensionally arranged plurality of patterns 11a of the phase shifting mirror 11. Referring to FIG. 3B, each pattern 11a may have, for example, a truncated conical shape, and the plurality of patterns 11a may be two-dimensionally arranged. Also, referring to FIG. 3C, each pattern 11a may have the truncated rectangular pyramid shape. In addition to the truncated rectangular pyramid shape, each pattern 11a may have various truncated polygonal pyramid shapes. Also, in FIGS. 3B and 3C, the plurality of patterns 11a are two-dimensionally arranged in a first direction and in a second direction perpendicular to the first direction to form a rectangular shape arrangement, but the plurality of patterns 11a may be two-dimensionally arranged to form a triangular or hexagonal shape arrangement. When the plurality of patterns 11a are two-dimensionally arranged, the width ba of the bottom surface 11b of each pattern 11a may be, for example, about 30 nm to about 300 nm. The ratio r obtained by dividing the width ta of the top surface 11t by the width ba of the bottom surface 11b may be, for example, greater than 0 and smaller than 1 (0<r<1), and the period p of the patterns 11a may satisfy a relationship of (the width ba of the bottom face 11b+10 nm)≤p≤(the wavelength of the light generated in the light emitting structure 20).

Referring again to FIG. 1, the phase shifting mirror 11 may form a resonator L together with the second electrode 18. That is, the resonator L may be formed between the phase shifting mirror 11 and the second electrode 18 of the light emitting device 100. Therefore, the light generated in the light emitting structure 20 may reciprocate and resonate between the phase shifting mirror 11 and the second electrode 18 and then light corresponding to a resonance wavelength of the resonator L may be emitted to the outside through the second electrode 18.

The resonance wavelength of the resonator L may be determined according to an optical length of the resonator L. For example, when the resonance wavelength of the resonator L is λ, the optical length of the resonator L may be nλ/2 (n is a natural number). The optical length of the resonator L may be determined as a sum of an optical thickness of the light emitting structure 20, an optical thickness of the transparent electrode 10a, an optical thickness between an upper surface of the dielectric layer 12 and the top surface 11t of the pattern 11a, a phase shift caused by the second electrode 18, and a phase shift caused by the phase shifting mirror 11. Here, the optical thickness of the light emitting structure 20, the optical thickness of the transparent electrode 10a, and the optical thickness between the upper surface of the dielectric layer 12 and the top surface 11t of the pattern 11a may not be merely a physical thickness but may be a thickness in consideration of refractive indexes of all materials between the second electrode 18 and the top surface 11t of each pattern 11a of the phase shifting mirror 11. According to the embodiment, the optical length or the resonance wavelength of the resonator L may be determined by adjusting only the phase shift caused by the phase shifting mirror 11 while fixing the optical thickness of the light emitting structure 20, the optical thickness of the transparent electrode 10a, the optical thickness between the upper surface of the dielectric layer 12 and the top surface 11t of the pattern 11a, and the phase shift caused by the second electrode 18.

As described above, the phase shift caused by the phase shifting mirror 11 may be determined according to at least one of the width ba of the bottom surface 11b of each pattern 11a, the width ta of the top surface 11t, the arrangement period of the patterns 11a, and the depth d of the patterns 11a. Therefore, the resonance wavelength of the resonator L formed between the phase shifting mirror 11 and the second electrode 18 may be determined according to at least one of the width ba of the bottom surface 11b of each pattern 11a of the phase shifting mirror 11, the width ta of the top surface 11t, the arrangement period of the patterns 11a, and the depth d of the patterns 11a. In other words, when the resonance wavelength of the resonator L is A and the optical thickness of the light emitting structure 20, the optical thickness of the transparent electrode 10a, the optical thickness between an upper surface of the dielectric layer 12 and the top surface 11t of the pattern 11a, and the phase shift caused by the second electrode 18 are fixed, at least one of the width ba of the bottom surface 11b of each pattern 11a of the phase shifting mirror 11, the width ta of the top surface 11t, the arrangement period of the patterns 11a, and the depth d of the patterns 11a may be selected such that the optical length of the resonator L is $n\lambda/2$ (n is a natural number). Therefore, the phase shifting mirror 11 may be appropriately configured, thereby easily matching the resonance wavelength of the resonator L in the light emitting device 100 with a light emitting wavelength of the light emitting device 100.

Figure 4:
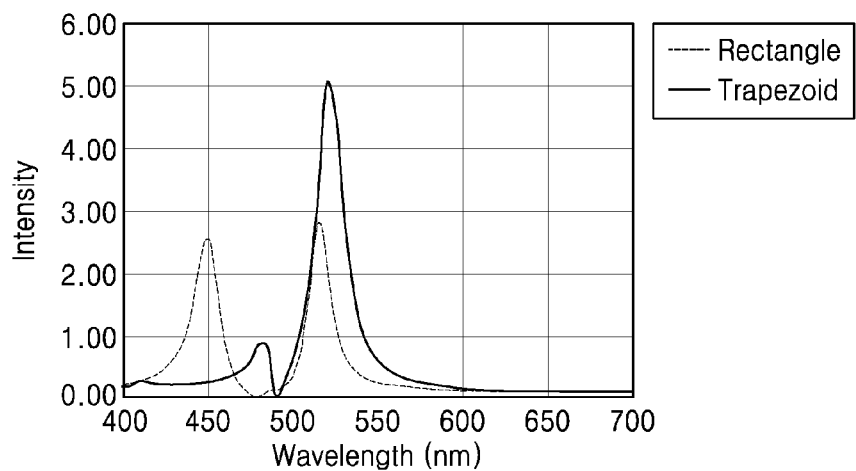
FIG. 4 is a graph of comparing spectra of reflected light according to a pattern shape in a phase shifting mirror configured to reflect light in a green wavelength band according to an embodiment.

FIG. 4 is a graph of comparing spectra of reflected light according to a pattern shape in the phase shifting mirror 11 configured to reflect light in a green wavelength band, according to an embodiment. The graph indicated by a solid line in FIG. 4 shows the spectrum of the reflected light when a shape of a cross-section of each pattern 11a is a trapezoid as in the embodiment, and the graph indicated by a dotted line shows the spectrum of the reflected light when a shape of a cross-section of each pattern is a rectangle as a comparative example. In the case where each of the patterns 11a has the trapezoid cross-section, the width ba of the bottom surface 11b of each pattern 11a may be 100 nm, the width ta of the top surface 11t may be 50 nm, the width g of the interval 11g between the two patterns 11a may be 250 nm, and the depth d of the pattern 11a may be 36 nm. In the comparative example, a width of a top surface may be equal to a width of a bottom surface, and a depth of the pattern may be 21 nm. Referring to FIG. 4, it may be seen that a peak of the solid line in a green wavelength region is much larger than a peak of the dotted line. It may also be seen that a peak of the dotted line in a blue wavelength region is only slightly smaller than the peak of the dotted line in the green wavelength region, but the peak of the solid line in the blue wavelength region is greatly suppressed. Accordingly, the color purity of light emitted from the light emitting device 100 may be improved.

Figure 5:
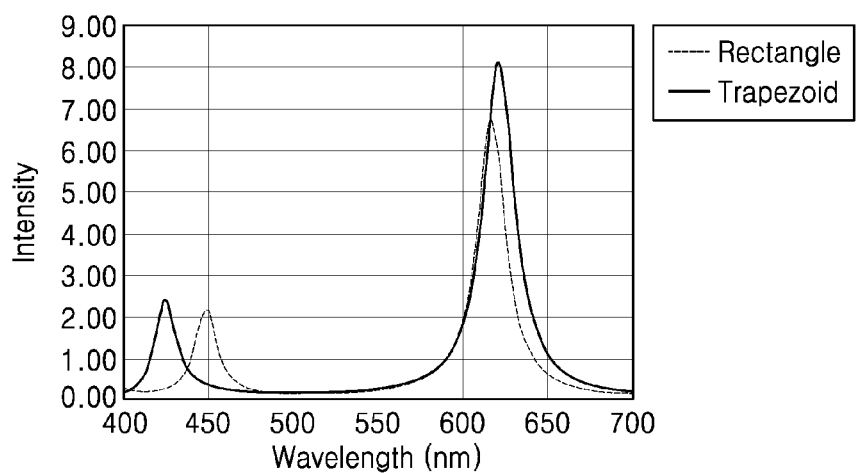
FIG. 5 is a graph of comparing spectra of reflected light according to a pattern shape in a phase shifting mirror configured to reflect light in a red wavelength band according to an embodiment.

FIG. 5 is a graph of comparing spectra of reflected light according to a pattern shape in the phase shifting mirror 11 configured to reflect light in a red wavelength band according to an embodiment. The graph indicated by a solid line in FIG. 5 shows the spectrum of the reflected light when a shape of a cross-section of each pattern 11a is a trapezoid as in the embodiment, and the graph indicated by a dotted line shows the spectrum of the reflected light when a shape of a cross-section of each pattern is a rectangle as a comparative example. In the case where each of the patterns 11a has the trapezoid cross-section, the width ba of the bottom surface 11b of each pattern 11a may be 100 nm, the width ta of the top surface 11t may be 50 nm, the width g of the interval 11g between the two patterns 11a may be 250 nm, and the depth d of the pattern 11a may be 96 nm. In the comparative example, a width of a top surface may be equal to a width of a bottom surface, and a depth of the pattern may be 71 nm. Referring to FIG. 5, it may be seen that a peak of the solid line in a red wavelength region is larger than a peak of the dotted line. It may also be seen that a small peak of the dotted line graph appears in a blue wavelength region, but a small peak of the solid line graph is closer to an ultraviolet region.

Figure 6:
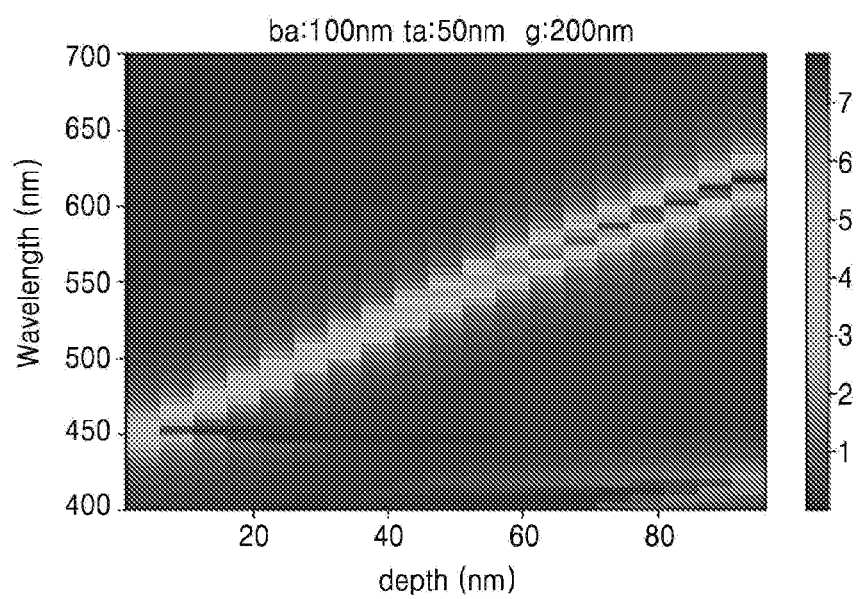
FIG. 6 is a chart illustrating simulation results regarding a relationship between a depth of a pattern and a wavelength of light emitted from a light emitting device according to an embodiment.

FIG. 6 shows simulation results of a relationship between the depth d of the pattern 11a and a wavelength of light emitted from the light emitting device 100 according to an embodiment. For example, a simulation is performed by fixing an optical thickness of the light emitting structure 20 to an integral multiple of ½ of a blue wavelength, the width ba of the bottom surface 11b of the pattern 11a to 100 nm, the width to of the pattern 11a to 200 nm, the width g of the interval 11g between the two patterns 11a to 200 nm and changing the depth d of the pattern 11a from 0 nm to 100 nm. It is assumed that white light is emitted from the light emitting structure 20. Referring to FIG. 6, when the depth d of the pattern 11a is small, since an influence of the phase shifting mirror 11 is reduced, the blue wavelength light may be emitted from the light emitting device 100. As the depth d of the pattern 11a becomes deeper, the wavelength of the light emitted from the light emitting device 100 may move in a long wavelength direction. When the depth d of the pattern 11a reaches about 90 nm, the light emitting device 100 may emits light of a red wavelength.

Figure 7:
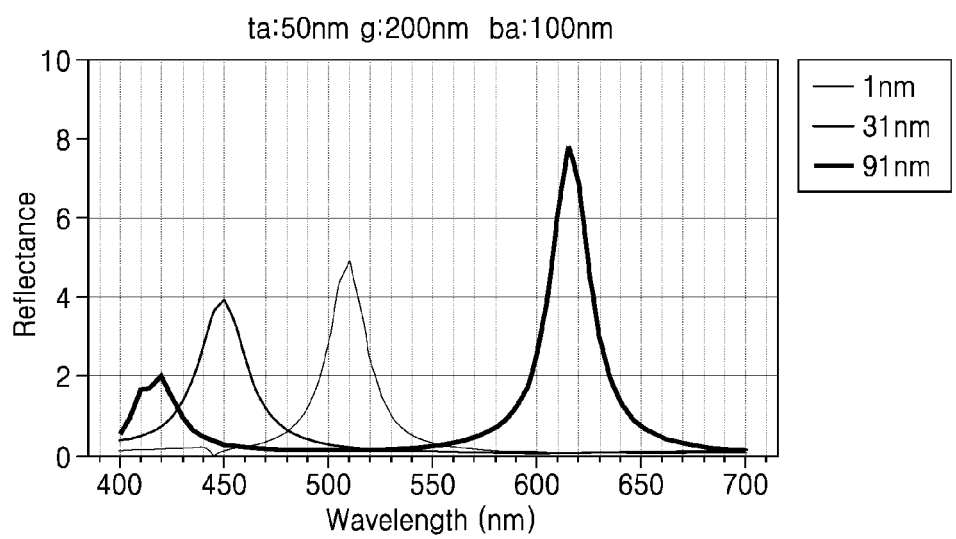
FIG. 7 is a graph showing a relationship between a depth of a pattern and spectra of light emitted from a light emitting device according to an embodiment.

FIG. 7 is a graph showing a relationship between the depth d of the pattern 11a and spectra of light emitted from the light emitting device 100, and shows simulation results under the same conditions as in FIG. 6 according to an embodiment. Referring to FIG. 7, when the depth d of the pattern 11a is 1 nm, the spectrum with respect to a blue wavelength may be obtained, when the depth d of the pattern 11a may be 31 nm, the spectrum with respect to a green wavelength may be obtained, and when the depth d of the pattern 11a is 91 nm, the spectrum with respect to a red wavelength may be obtained.

Therefore, it may be seen that a resonance wavelength of the resonator L of the light emitting device 100 may be adjusted by adjusting only the depth d of the pattern 11a of the phase shifting mirror 11. In other words, the light emitting device 100 may easily match the resonance wavelength of the resonator L with a light emitting wavelength or a light emitting color of the light emitting device 100 by changing only the depth d of the patterns 11a while fixing an optical thickness of the light emitting structure 20, an optical thickness of the transparent electrode 10a, an optical thickness between an upper surface of the dielectric layer 12 and the top surface 11t of the pattern 11a, the width ba of the bottom surface 11b of the pattern 11a of the phase shifting mirror 11, the width ta of the top surface 11t and an arrangement period of the patterns 11a at appropriate values. Accordingly, the color purity of the light emitted from the light emitting device 100 may be easily improved. The depth d of the pattern 11a may differ according to the optical thickness of the light emitting structure 20, the optical thickness of the transparent electrode 10a, the optical thickness between an upper surface of the dielectric layer 12 and the top surface 11t of the pattern 11a, the width ba of the bottom surface 11b of the pattern 11a of the phase shifting mirror 11, the width ta of the top surface 11t and the arrangement period of the patterns 11a but may be selected approximately between 0 nm to about 250 nm.

For example, when the light emitting device 100 is a red light emitting device, the width ba of the bottom surface 11b of each pattern 11a of the phase shifting mirror 11, the width to of the top surface 11t, the arrangement period of the patterns 11a, and the depth d of the patterns 11a may be selected such that the resonance frequency of the resonator L corresponds to a red wavelength band. The organic emission layer 15 may include only a red light emitting material. Instead, the organic emission layer 15 may include all a blue light emitting material, a green light emitting material, and the red light emitting material. A light emitting wavelength of the light emitting device 100 may be determined only by dimension of the patterns 11a of the phase shifting mirror 11.

Figure 8:
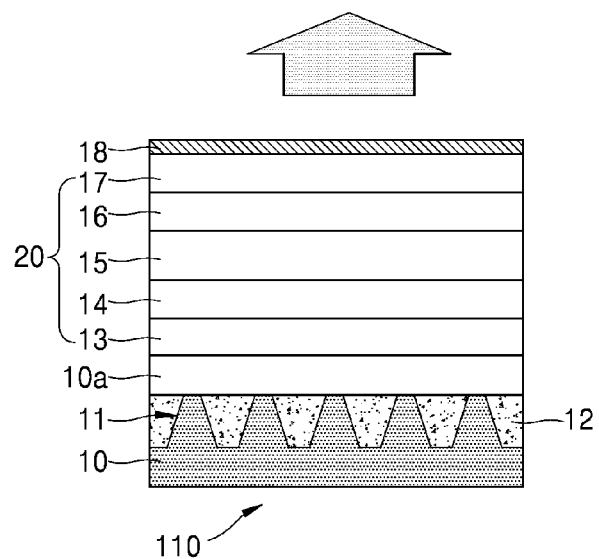
FIG. 8 is a cross-sectional view schematically showing a structure of a light emitting device according to another embodiment.

FIG. 8 is a cross-sectional view schematically showing a structure of a light emitting device 110 according to another embodiment. Referring to FIG. 8, the light emitting device 110 may include the dielectric layer 12 filled only between the plurality of patterns 11a of the phase shifting mirror 11. For example, an upper surface of the dielectric layer 12 may be coplanar with a top surface of the patterns 11a. In this case, the transparent electrode 10a may be electrically connected to the first electrode 10 without additional wiring. The remaining configuration of the light emitting device 110 shown in FIG. 8 may be the same as that of the light emitting device 100 shown in FIG. 1.

Figure 9:
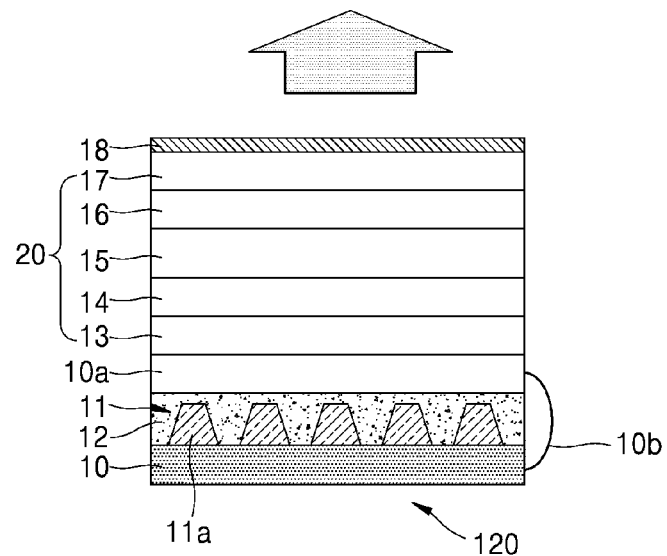
FIG. 9 is a cross-sectional view schematically showing a structure of a light emitting device according to an embodiment.

Although the phase shifting mirror 11 is formed integrally with the first electrode 10 above, the phase shifting mirror 11 and the first electrode 10 may be separately formed. For example, FIG. 9 is a cross-sectional view schematically showing a structure of a light emitting device 120 according to another embodiment. Referring to FIG. 9, the light emitting device 120 may include the first electrode 10 having a flat upper surface and the phase shifting mirror 11 stacked on the upper surface of the first electrode 10. The phase shifting mirror 11 may be additionally formed on the previously formed flat first electrode 10. In this case, the phase shifting mirror 11 may include the same reflective metal material as the first electrode 10 or may include a different reflective metal material from the first electrode 10.

Figure 10:
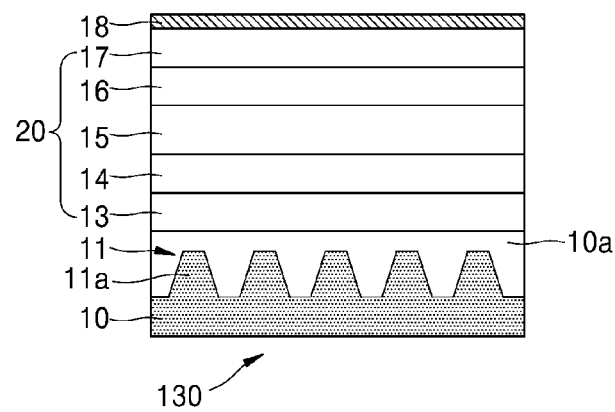
FIG. 10 is a cross-sectional view schematically showing a structure of a light emitting device according to an embodiment.

Also, FIG. 10 is a cross-sectional view schematically showing a structure of a light emitting device 130 according to another embodiment. The light emitting device 130 shown in FIG. 10 may not include a separate dielectric layer, and the transparent electrode 10a may be directly disposed on the phase shifting mirror 11. The transparent electrode 10a may be disposed between the phase shifting mirror 11 and the light emitting structure 20 to serve as a planarization layer for forming the light emitting structure 20. To this end, the transparent electrode 10a may be configured to fill between the plurality of patterns 11a of the phase shifting mirror 11 and completely cover a top surface of the patterns 11a. Further, an upper surface of the transparent electrode 10a may be configured to be flat. In this case, the transparent electrode 10a may be electrically connected to the first electrode 10 without additional wiring.

Figure 11:
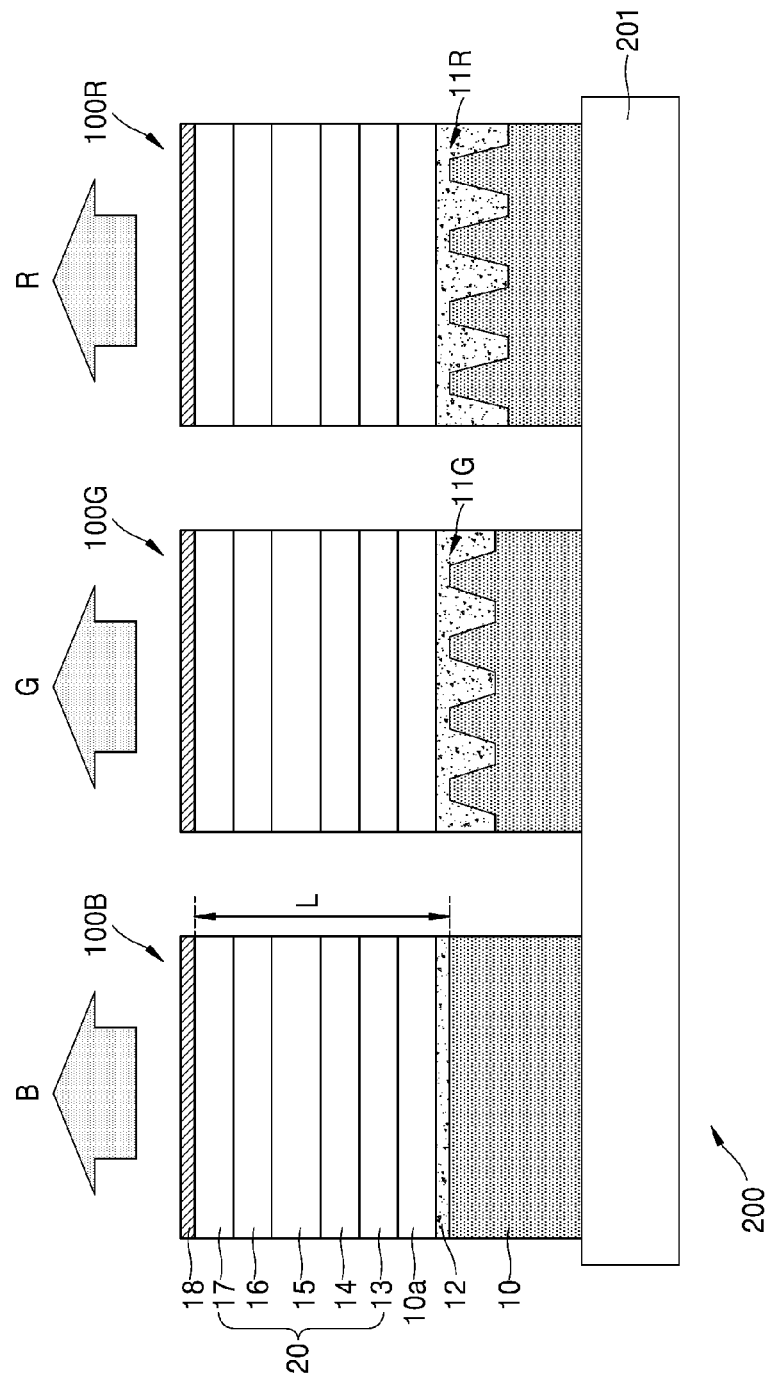
FIG. 11 is a cross-sectional view schematically showing a structure of a display apparatus according to an embodiment.

The above-described light emitting devices 100, 110, 120, and 130 may be applied to a display apparatus since they may adjust a resonance wavelength of a resonator within a wavelength band of visible light according to a structure of the phase shifting mirror 11. For example, FIG. 11 is a cross-sectional view schematically showing a structure of a display apparatus 200 according to an embodiment. Referring to FIG. 11, the display apparatus 200 according to an embodiment may include a substrate 201 and a first pixel 100B, a second pixel 100G, and a third pixel 100R arranged on the substrate 201 in a line. Although the first through third pixels 100B, 100G, and 100R shown in FIG. 11 have the same structure as the light emitting device 100 shown in FIG. 1, the first through third pixels 100B, 100G, and 100R may have the same structures as the light emitting devices 110, 120, and 130 shown in FIGS. 8 to 10. Also, although only one of the first through third pixels 100B, 100G, and 100R is illustrated in FIG. 11 for the sake of convenience, a very large number of the first through third pixels 100B, 100G, and 100R may be repeatedly arranged actually.

For example, each of the first to third pixels 100B, 100G, and 100R may include the first electrode 10 disposed on the substrate 201 and including the phase shifting mirror 11, the dielectric layer 12 disposed on the phase shifting mirror 11, the transparent electrode 10a disposed on the dielectric layer 12, the light emitting structure 20 disposed on the transparent electrode 10a, and the second electrode 18 disposed on the light emitting structure 20. When the display apparatus 200 is an OLED apparatus, the light emitting structure 20 of each of the first to third pixels 100B, 100G and 100R may include the hole injection layer 13 disposed on the transparent electrode 10a, the hole transport layer 14 disposed on the hole injection layer 13, the organic emission layer 15 disposed on the hole transport layer 14, the electron transport layer 16 disposed on the organic emission layer 15, and the electron injection layer 17 disposed on the electron transport layer 16.

The first to third pixels 100B, 100G, and 100R may be configured to emit light of different wavelengths. For example, the first pixel 100B may be configured to emit light B of a first wavelength band $\lambda_1$ that is a blue wavelength band, the second pixel 100G may be configured to emit light G of a second wavelength band $\lambda_2$ that is a green wavelength band, and the third pixel 100R may be configured to emit light R of a third wavelength band $\lambda_3$ that is a red wavelength band. To this end, optical lengths of resonators of the first through third pixels 100B, 100G, and 100R may be configured to be different from each other. As described above, the optical length of the resonator may be determined as a sum of an optical thickness of the light emitting structure 20, an optical thickness of the transparent electrode 10a, an optical thickness of the dielectric layer 12, a phase shift caused by the second electrode 18, and a phase shift caused by the phase shifting mirror 11. According to the embodiment, the optical length or a resonance wavelength of the resonator may be determined by adjusting only the phase shift caused by the phase shifting mirror 11 while fixing the optical thickness of the light emitting structure 20, the optical thickness of the transparent electrode 10a, the optical thickness of the dielectric layer 12, and the phase shift caused by the second electrode 18. For example, a phase shift $\varphi_1$ of the first pixel 100B caused by the phase shifting mirror 11, a phase shift $\varphi_2$ of the second pixel 100G caused by the phase shifting mirror 11, and a phase shift $\varphi_3$ of the third pixel 100R caused by the phase shifting mirror 11 may be configured to be different from each other.

In other words, the width ba of the bottom surface 11b of each pattern 11a of the phase shifting mirror 11 of the first pixel 100B, the width ta of the top surface 11t of each pattern 11a of the phase shifting mirror 11 of the first pixel 100B, an arrangement period of the patterns 11a of the phase shifting mirror 11 of the first pixel 100B, and the depth d of the patterns 11a of the phase shifting mirror 11 of the first pixel 100B may be selected such that the resonance wavelength of the resonator of the first pixel 100B corresponds to the first wavelength band $\lambda_1$, the width ba of the bottom surface 11b of each pattern 11a of the phase shifting mirror 11 of the second pixel 100G, the width ta of the top surface 11t of each pattern 11a of the phase shifting mirror 11 of the second pixel 100G, the arrangement period of the patterns 11a of the phase shifting mirror 11 of the second pixel 100G, and the depth d of the patterns 11a of the phase shifting mirror 11 of the second pixel 100G may be selected such that the resonance wavelength of the resonator of the second pixel 100G corresponds to the second wavelength band $\lambda_2$, and the width ba of the bottom surface 11b of each pattern 11a of the phase shifting mirror 11 of the third pixel 100R, the width ta of the top surface 11t of each pattern 11a of the phase shifting mirror 11 of the third pixel 100R, the arrangement period of the patterns 11a of the phase shifting mirror 11 of the third pixel 100R, and the depth d of the patterns 11a of the phase shifting mirror 11 of the third pixel 100R may be selected such that the resonance wavelength of the resonator of the third pixel 100R corresponds to the third wavelength band $\lambda_3$.

More specifically, the width ba of the bottom surface 11b of each pattern 11a of the phase shifting mirror 11, the width ta of the top surface 11t, the arrangement period of the patterns 11a, and the depth d of the patterns 11a in the first pixel 100B may be selected such that the optical length of the resonator of the first pixel 100B is $n\lambda_1/2$, the width ba of the bottom surface 11b of each pattern 11a of the phase shifting mirror 11, the width ta of the top surface 11t, the arrangement period of the patterns 11a, and the depth d of the patterns 11a in the second pixel 100G may be selected such that the optical length of the resonator of the second pixel 100G is $n\lambda_2/2$, and the width ba of the bottom surface 11b of each pattern 11a of the phase shifting mirror 11, the width ta of the top surface 11t, the arrangement period of the patterns 11a, and the depth d of the patterns 11a in the third pixel 100R may be selected such that the optical length of the resonator of the third pixel 100R is $n\lambda_3/2$. Here, n may be a natural number.

As described above, the optical length of the resonator may be adjusted according to the width ba of the bottom surface 11b of each pattern 11a of the phase shifting mirror 11, the width ta of the top surface 11t, the arrangement period of the patterns 11a, and the depth d of the patterns 11a. Also, as described with reference to FIGS. 6 and 7, a resonance wavelength of the resonator in a visible light region may be sufficiently adjusted by adjusting only the depth d of the patterns 11a while fixing the width ba of the bottom surface 11b of each pattern 11a of the phase shifting mirror 11, the width ta of the top surface 11t, and the arrangement period of the patterns 11a to specific values.

As a result, since it is unnecessary to adjust a thickness of each of the first through third pixels 100B, 100G, and 100R to adjust the optical length of the resonator of each of the first through third pixels 100B, 100G, and 100R, the display apparatus 200 may configure the thicknesses of the first through third pixels 100B, 100G and 100R to be the same. For example, optical lengths between the second electrode 18 and the first electrode 10 in the first through third pixels 100B, 100G, and 100R may be the same. Accordingly, a manufacturing process of the display apparatus 200 may be simplified, and thus the display apparatus 200 may easily have a large area. Further, since the resonance wavelength of the resonator of each of the first through third pixels 100B, 100G, and 100R may be accurately adjusted, the color purity of the display apparatus 200 may be improved.

For example, in the case of the display apparatus 200 shown in FIG. 11, the depth d of the patterns 11a of the phase shifting mirror 11 in the first pixel 100B may be 0 nm. In other words, the first electrode 10 may have a flat upper surface. In this case, it may be seen that the phase shifting mirror 11 is not formed in the first pixel 100B. The second pixel 100G and the third pixel 100R may include a second phase shifting mirror 11G and a third phase shifting mirror 11R having different depths d of the patterns 11a respectively. For example, the depth d of the patterns 11a of the second phase shifting mirror 11G may be about 30 nm, and the depth d of the patterns 11a of the third phase shifting mirror 11R may be about 90 nm. The configurations of the first through third pixels 100B, 100G and 100R may be completely the same except for the depth d of the patterns 11a.

Meanwhile, the organic emission layers 15 of the first through third pixels 100B, 100G, and 100R may be configured differently. For example, the organic emission layer 15 of the first pixel 100B may include a light emitting material that emits blue light, the organic emission layer 15 of the second pixel 100G may include a light emitting material that emits green light, and the organic emission layer 15 of the third pixel 100R may include a light emitting material that emits red light. However, since light emitting characteristics of the first through third pixels 100B, 100G, and 100R may be determined only by a structure of the phase shifting mirror 11, the organic emission layers 15 of the first through third pixels 100B, 100G, and 100R may be configured to be the identical to each other. For example, the organic emission layers 15 of the first through third pixels 100B, 100G, and 100R may all be configured to emit white visible light. When the organic emission layers 15 of the first through third pixels 100B, 100G, and 100R are the same, the manufacturing process of the display apparatus 200 may be further simplified.

Figure 12:
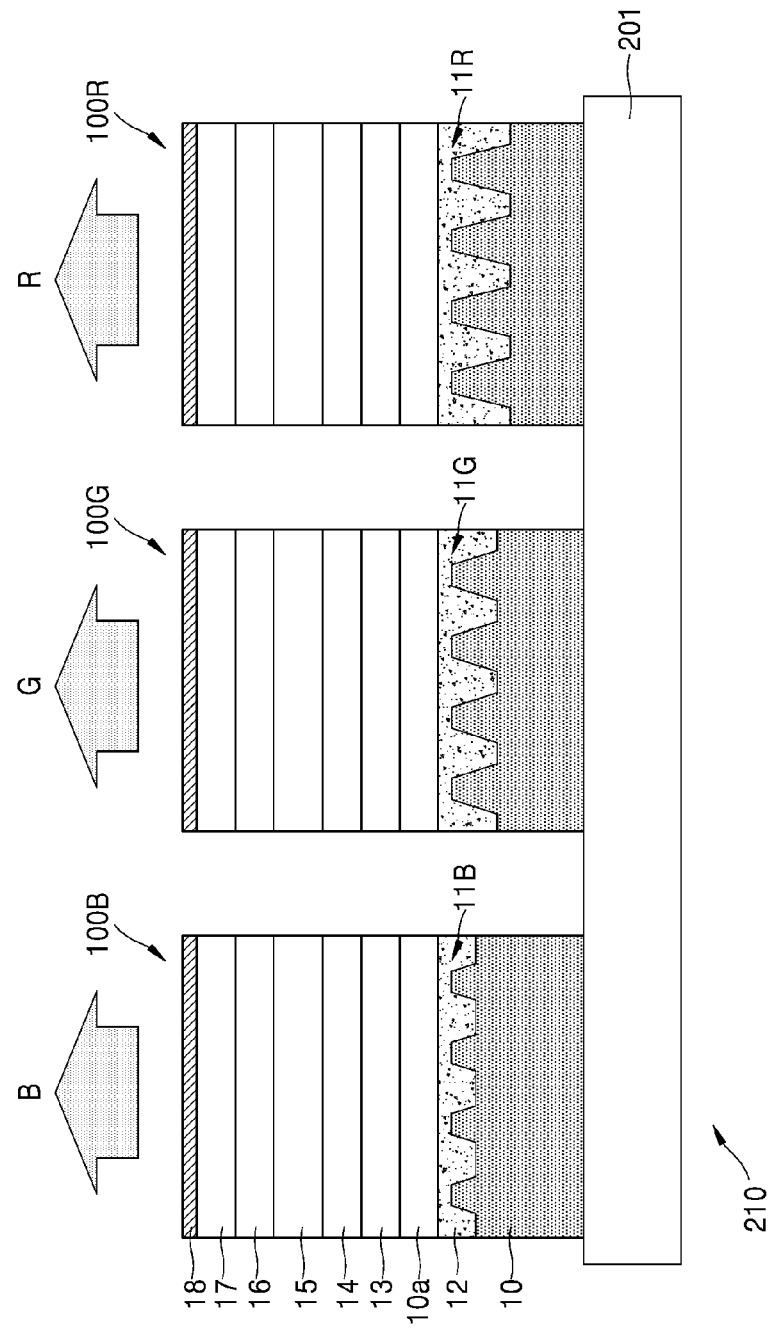
FIG. 12 is a cross-sectional view schematically showing a structure of a display apparatus according to another embodiment.

The phase shifting mirror 11 is not formed in the first pixel 100B in the display apparatus 200 shown in FIG. 11, but the phase shifting mirror 11 may be formed in the first pixel 100B according to dimensions of the patterns 11a. For example, FIG. 12 is a cross-sectional view schematically showing a structure of a display apparatus 210 according to another embodiment. The first pixel 100B of the display apparatus 210 shown in FIG. 12 may include a first phase shifting mirror 11B, the second pixel 100G may include a second phase shifting mirror 11G, and the third pixel 100R may include a third phase shifting mirror 11R. In this case, the depth d of the patterns 11a of the second phase shifting mirror 11G may be larger than the depth d of the patterns 11a of the first phase shifting mirror 11B, and the depth d of the patterns 11a of the third phase shifting mirror 11R may be larger than the depth d of the patterns 11a of the second phase shifting mirror 11G.

Further, since the light emitting characteristics of the first through third pixels 100B, 100G, and 100R may be determined only by structures of the phase shifting mirrors 11, the display apparatuses 200 and 210 may not include a separate color filter. However, to further improve the color purity of the display apparatuses 200 and 210, a color filter may be further disposed as necessary. For example, FIG. 13 is a cross-sectional view schematically showing a structure of a display apparatus 220 according to another embodiment. Referring to FIG. 13, the display apparatus 220 may include a first color filter 30B disposed on the first pixel 100B, a second color filter 30G disposed on the second pixel 100G, and a third color filter 30R disposed on the third pixel 100R. For example, the first color filter 30B may be configured to emit only the light B of the first wavelength band $\lambda_1$ that is a blue wavelength band, the second color filter 30G may be configured to emit only the light G of the second wavelength band $\lambda_2$ that is a green wavelength band, and the third color filter 30R may be configured to emit only the light R of the third wavelength band $\lambda_3$ that is a red wavelength band. The remaining structure of the display apparatus 220 may be the same as the display apparatus 200 shown in FIG. 11 or the display apparatus 210 shown in FIG. 12.

While the light emitting device and the display apparatus including the light emitting device described above have been shown and described in connection with the embodiments illustrated in the drawings, it will be understood by those of ordinary skill in the art that various modifications and equivalent embodiments may be made therefrom. Therefore, the disclosed embodiments should be considered in an illustrative sense rather than a restrictive sense. The range of the embodiments will be in the appended claims, and all of the differences in the equivalent range thereof should be understood to be included in the embodiments.

What is claimed is:

1. A light emitting device comprising:
   a first electrode;
   a light emitting structure disposed on the first electrode;
   a second electrode disposed on the light emitting structure; and
   a phase shifting mirror formed on a top surface of the first electrode, the phase shifting mirror comprising a plurality of patterns arranged in a periodic manner with an interval between adjacent patterns,
   wherein each of the plurality of patterns comprises a top surface and a side surface between the top surface of the respective pattern and the top surface of the first electrode,
   wherein a first width at a bottom portion of the respective pattern directly adjacent to the top surface of the first electrode is greater than a second width of the top surface of the respective pattern,
   wherein the first width and the second width are less than a wavelength of light generated in the light emitting structure,
   wherein the phase shifting mirror is configured to change a phase of light reflected by the phase shifting mirror, and
   wherein the phase shifting mirror and the second electrode constitute a resonator having a resonance wavelength such that the resonance wavelength is matched with a light emitting wavelength of the light emitting device.

2. The light emitting device of claim 1, wherein the resonance wavelength of the resonator is determined according to at least one of the first width, the second width, a depth of each of the plurality of patterns, and an arrangement period of the plurality of patterns.

3. The light emitting device of claim 2, wherein when the resonance wavelength of the resonator is $\lambda$, at least one of the first width, the second width, the depth of each of the plurality of patterns, and the arrangement period of the plurality of patterns is selected such that an optical length of the resonator satisfies $n\lambda/2$, n is a natural number.

4. The light emitting device of claim 1, wherein the second electrode is a transflective electrode that reflects a part of light and transmits another part of the light.

5. The light emitting device of claim 1, wherein the side surface of each of the plurality of patterns is an inclined surface.

6. The light emitting device of claim 1, wherein each of the plurality of patterns has a rod shape extending in a first direction, and the plurality of patterns are arranged along a second direction perpendicular to the first direction.

7. The light emitting device of claim 1, wherein each of the plurality of patterns has a truncated conical shape or a truncated polygonal pyramid shape, and the plurality of patterns are two-dimensionally arranged.

8. The light emitting device of claim 1,
   wherein the first electrode comprises a reflective metal material, and
   wherein the phase shifting mirror comprises a same reflective metal material as the first electrode.

9. The light emitting device of claim 1,
   wherein the first electrode comprises a reflective metal material, and
   wherein the phase shifting mirror comprises a different reflective metal material from the first electrode.

10. The light emitting device of claim 1, wherein a sum of the first width and the second width is less than the wavelength of the light generated in the light emitting structure.

11. The light emitting device of claim 1, wherein a sum of the first width and the second width is less than ⅓ of the wavelength of the light generated in the light emitting structure.

12. The light emitting device of claim 1, further comprising:
    a dielectric layer is formed between the plurality of patterns of the phase shifting mirror.

13. The light emitting device of claim 12,
    wherein the dielectric layer is configured to completely cover top surfaces of the plurality of patterns, and
    wherein the light emitting device further comprises:
    a transparent electrode disposed between the dielectric layer and the light emitting structure.

14. The light emitting device of claim 13, further comprising:
    a wiring configured to electrically connect the first electrode to the transparent electrode.

15. The light emitting device of claim 1, further comprising:
    a transparent electrode disposed between the phase shifting mirror and the light emitting structure.

16. A display apparatus comprising:
    a first pixel configured to emit light of a first wavelength; and
    a second pixel configured to emit light of a second wavelength different from the first wavelength,
    wherein the first pixel comprises:
    a first electrode;
    a first light emitting structure disposed on the first electrode;
    a second electrode disposed on the first light emitting structure; and
    a first phase shifting mirror formed on a top surface of the first electrode, the first phase shifting mirror comprising a plurality of patterns arranged in a periodic manner,
    wherein each of the plurality of patterns comprises a top surface and a side surface between the top surface of the respective pattern and the top surface of the first electrode,
    wherein a first width at a bottom portion of the respective pattern directly adjacent to the top surface of the first electrode is greater than a second width of the top surface of the respective pattern,
    wherein the first width and the second width are less than a wavelength of light generated in the first light emitting structure,
    wherein the first phase shifting mirror is configured to change a phase of light reflected by the first phase shifting mirror, and
    wherein the first phase shifting mirror and the second electrode constitute a first resonator having a first resonance wavelength such that the first resonance wavelength is matched with the first wavelength of the light emitted from the first pixel.

17. The display apparatus of claim 16, wherein a distance between the second electrode and the top surface of each of the plurality of patterns, the first width of each of the plurality of patterns, the second width of each of the plurality of patterns, and a depth of each of the plurality of patterns are selected such that the first resonance wavelength of the first resonator is identical to the first wavelength.

18. The display apparatus of claim 17, wherein the second pixel comprises:
- a third electrode;
- a second light emitting structure disposed on the third electrode;
- a fourth electrode disposed on the second light emitting structure; and
- a second phase shifting mirror formed on a top surface of the third electrode, the second phase shifting mirror comprising a plurality of patterns arranged in a periodic manner, wherein each of the plurality of patterns of the second pixel comprises a top surface and a side surface between the top surface of the respective pattern and the top surface of the third electrode, wherein a third width at a bottom portion of the respective pattern directly adjacent to the top surface of the third electrode of each of the plurality of patterns of the second pixel is greater than a fourth width of the respective pattern of each of the plurality of patterns of the second pixel, and wherein the second phase shifting mirror is configured to change a phase of light reflected by the second phase shifting mirror, and wherein the second phase shifting mirror and the fourth electrode constitute a second resonator having a second resonance wavelength such that the second resonance wavelength is matched with the second wavelength of the light emitted from the second pixel.

19. The display apparatus of claim 18, wherein a distance between the fourth electrode and the top surface of each of the plurality of patterns of the second pixel and a distance between the second electrode and the top surface of each of the plurality of patterns of the first pixel are same, and wherein the depth of each of the plurality of patterns of the second pixel is different from the depth of each of the plurality of patterns of the first pixel.

20. The display apparatus of claim 19, wherein both the first light emitting structure and the second light emitting structure are configured to emit white visible light.

* * * * *